United States Patent
Lee

(10) Patent No.: US 7,610,457 B2
(45) Date of Patent: Oct. 27, 2009

(54) INTERLEAVING METHOD AND SYSTEM

(75) Inventor: Jeong-sang Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 442 days.

(21) Appl. No.: 11/485,449

(22) Filed: Jul. 13, 2006

(65) Prior Publication Data

US 2007/0022262 A1    Jan. 25, 2007

(30) Foreign Application Priority Data

Jul. 19, 2005    (KR)    ...................... 10-2005-0065495

(51) Int. Cl.
*G06F 13/00*    (2006.01)
(52) U.S. Cl. ...................................... 711/157
(58) Field of Classification Search .................. 711/157
See application file for complete search history.

(56) References Cited

U.S. PATENT DOCUMENTS

| 5,392,443 | A | 2/1995 | Sakakibara et al. |
|---|---|---|---|
| 6,381,668 | B1 | 4/2002 | Lunteren |
| 6,553,517 | B1 * | 4/2003 | Prasad ........................ 714/702 |
| 2002/0083248 | A1 | 6/2002 | Uto | |
| 2004/0151109 | A1 | 8/2004 | Batra et al. | |
| 2004/0178934 | A1 | 9/2004 | Balakrishnan et al. | |
| 2005/0050428 | A1 | 3/2005 | Urard et al. | |

FOREIGN PATENT DOCUMENTS

WO    WO 2005/055544 A1    6/2005

OTHER PUBLICATIONS

Nur Engin: "A turbo decoder architechture with scalable parallelism", Proc. Workshop on Signal Processing Systems SIPS 2004, Oct. 13, 2004, pp. 298-303, ISBN: 0/7803-8504-7.

* cited by examiner

*Primary Examiner*—Reginald G Bragdon
*Assistant Examiner*—Larry T Mackall
(74) *Attorney, Agent, or Firm*—Sughrue Mion, PLLC

(57) ABSTRACT

An interleaving method employing symbol interleaving, tone interleaving, and cyclic interleaving for transmitting data includes storing data at write address values in a memory which are sequentially calculated according to a predetermined process, and reading data stored at read address values of the memory which are sequentially calculated according to a predetermined process, wherein the memory has N data banks, each data bank has M storage spaces, and there are D interleaving target data having data numbers A, and the storing data operation includes storing the data at storage spaces of the data banks, the storage spaces corresponding to integer values and the data banks corresponding to remainders obtained by dividing the data numbers A by results of dividing a total number of data D by the number of storage spaces M.

34 Claims, 6 Drawing Sheets

| | | | | | | | | | | |
|---|---|---|---|---|---|---|---|---|---|---|
| 0 | 30 | 60 | 90 | 120 | 150 | 180 | 210 | 240 | 270 | } 10a |
| 3 | 33 | 63 | 93 | 123 | 153 | 183 | 213 | 243 | 273 | } 10b |
| 6 | 36 | 66 | 96 | 126 | 156 | 186 | 216 | 246 | 276 | } 10c |
| 9 | 39 | 69 | 99 | 129 | 159 | 189 | 219 | 249 | 279 | } 10d |
| 12 | 42 | 72 | 102 | 132 | 162 | 192 | 222 | 252 | 282 | } 10e |
| 15 | 45 | 75 | 105 | 135 | 165 | 195 | 225 | 255 | 285 | } 10f |
| 18 | 48 | 78 | 108 | 138 | 168 | 198 | 228 | 258 | 288 | } 10g |
| 21 | 51 | 81 | 111 | 141 | 171 | 201 | 231 | 261 | 291 | } 10h |
| 24 | 54 | 84 | 114 | 144 | 174 | 204 | 234 | 264 | 294 | } 10i |
| 27 | 57 | 87 | 117 | 147 | 177 | 207 | 237 | 267 | 297 | } 10j |

FIG. 3B
(RELATED ART)

| | | | | | | | | | | |
|---|---|---|---|---|---|---|---|---|---|---|
| 0 | 31 | 61 | 91 | 121 | 151 | 181 | 211 | 241 | 271 | } 20a |
| 4 | 34 | 64 | 94 | 124 | 154 | 184 | 214 | 244 | 274 | } 20b |
| 7 | 37 | 67 | 97 | 127 | 157 | 187 | 217 | 247 | 277 | } 20c |
| 10 | 40 | 70 | 100 | 130 | 160 | 190 | 220 | 250 | 280 | } 20d |
| 13 | 43 | 73 | 103 | 133 | 163 | 193 | 223 | 253 | 283 | } 20e |
| 16 | 46 | 76 | 106 | 136 | 166 | 196 | 226 | 256 | 286 | } 20f |
| 19 | 49 | 79 | 109 | 139 | 169 | 199 | 229 | 259 | 289 | } 20g |
| 22 | 52 | 82 | 112 | 142 | 172 | 201 | 232 | 262 | 292 | } 20h |
| 25 | 55 | 85 | 115 | 145 | 175 | 204 | 235 | 265 | 295 | } 20i |
| 28 | 58 | 88 | 118 | 148 | 178 | 208 | 238 | 268 | 298 | } 20j |

FIG. 3C
(RELATED ART)

| | | | | | | | | | | |
|---|---|---|---|---|---|---|---|---|---|---|
| 2 | 31 | 62 | 92 | 122 | 152 | 182 | 212 | 242 | 272 | } 30a |
| 5 | 35 | 65 | 95 | 125 | 155 | 185 | 215 | 245 | 275 | } 30b |
| 8 | 38 | 68 | 98 | 128 | 158 | 188 | 218 | 248 | 278 | } 30c |
| 11 | 41 | 71 | 101 | 131 | 161 | 191 | 221 | 251 | 281 | } 30d |
| 14 | 44 | 74 | 104 | 134 | 164 | 194 | 224 | 254 | 284 | } 30e |
| 17 | 47 | 77 | 107 | 137 | 167 | 197 | 227 | 257 | 287 | } 30f |
| 20 | 50 | 80 | 110 | 140 | 170 | 200 | 230 | 260 | 290 | } 30g |
| 23 | 53 | 83 | 113 | 143 | 173 | 203 | 233 | 263 | 293 | } 30h |
| 26 | 56 | 86 | 116 | 146 | 176 | 206 | 236 | 266 | 296 | } 30i |
| 29 | 59 | 89 | 119 | 149 | 179 | 209 | 239 | 269 | 299 | } 30j |

FIG. 4A
(RELATED ART)

□ : ARRAY A
▨ : ARRAY B
▩ : ARRAY C

| 0 | 30 | 60 | 90 | 120 | 150 | 180 | 210 | 240 | 270 |
|---|---|---|---|---|---|---|---|---|---|
| 3 | 33 | 63 | 93 | 123 | 153 | 183 | 213 | 243 | 273 |
| 6 | 36 | 66 | 96 | 126 | 156 | 186 | 216 | 246 | 276 |
| 9 | 39 | 69 | 99 | 129 | 159 | 189 | 219 | 249 | 279 |
| 12 | 42 | 72 | 102 | 132 | 162 | 192 | 222 | 252 | 282 |
| 15 | 45 | 75 | 105 | 135 | 165 | 195 | 225 | 255 | 285 |
| 18 | 48 | 78 | 108 | 138 | 168 | 198 | 228 | 258 | 288 |
| 21 | 51 | 81 | 111 | 141 | 171 | 201 | 231 | 261 | 291 |
| 24 | 54 | 84 | 114 | 144 | 174 | 204 | 234 | 264 | 294 |
| 27 | 57 | 87 | 117 | 147 | 177 | 207 | 237 | 267 | 297 |

ARRAY A: | 0 | 30 | 60 | 90 | 120 | 150 | 180 | 210 | 240 | 270 | 3 | 33 | 63 | 93 | 123 | 153 | 183 | 213 | 243 | 273 | 6 | 36 | 66 | 96 | 126 | 156 | 186 | 216 | 246 | 276 | 9 | 39 | 69 |

ARRAY B: | 99 | 129 | 159 | 189 | 219 | 249 | 279 | 12 | 42 | 72 | 102 | 132 | 162 | 192 | 222 | 252 | 282 | 15 | 45 | 75 | 105 | 135 | 165 | 195 | 225 | 255 | 285 | 18 | 48 | 78 | 108 | 138 | 168 |

ARRAY C: | 198 | 228 | 258 | 288 | 21 | 51 | 81 | 111 | 141 | 171 | 201 | 231 | 261 | 291 | 24 | 54 | 84 | 114 | 144 | 174 | 204 | 234 | 264 | 294 | 27 | 57 | 87 | 117 | 147 | 177 | 207 | 237 | 267 | 297 |

FIG. 4B (RELATED ART)

□ : ARRAY A
▨ : ARRAY B
▩ : ARRAY C

FIG. 4C
(RELATED ART)

☐ : ARRAY A
▨ : ARRAY B
▧ : ARRAY C

| 2 | 31 | 62 | 92 | 122 | 152 | 182 | 212 | 242 | 272 |
|---|---|---|---|---|---|---|---|---|---|
| 5 | 35 | 65 | 95 | 125 | 155 | 185 | 215 | 245 | 275 |
| 8 | 38 | 68 | 98 | 128 | 158 | 188 | 218 | 248 | 278 |
| 11 | 41 | 71 | 101 | 131 | 161 | 191 | 221 | 251 | 281 |
| 14 | 44 | 74 | 104 | 134 | 164 | 194 | 224 | 254 | 284 |
| 17 | 47 | 77 | 107 | 137 | 167 | 197 | 227 | 257 | 287 |
| 20 | 50 | 80 | 110 | 140 | 170 | 200 | 230 | 260 | 290 |
| 23 | 53 | 83 | 113 | 143 | 173 | 203 | 233 | 263 | 293 |
| 26 | 56 | 86 | 116 | 146 | 176 | 206 | 236 | 266 | 296 |
| 29 | 59 | 89 | 119 | 149 | 179 | 209 | 239 | 269 | 299 |

ARRAY C: 200 | 230 | 260 | 290 | 23 | 53 | 83 | 113 | 143 | 173 | 203 | 233 | 263 | 293 | 26 | 56 | 86 | 116 | 146 | 176 | 206 | 236 | 266 | 296 | 29 | 59 | 89 | 119 | 149 | 179 | 209 | 239 | 269 | 299

ARRAY A: 2 | 31 | 62 | 92 | 122 | 152 | 182 | 212 | 242 | 272 | 5 | 35 | 65 | 95 | 125 | 155 | 185 | 215 | 245 | 275 | 8 | 38 | 68 | 98 | 128 | 158 | 188 | 218 | 248 | 278 | 11 | 41 | 71

ARRAY B: 101 | 131 | 161 | 191 | 221 | 251 | 281 | 14 | 44 | 74 | 104 | 134 | 164 | 194 | 224 | 254 | 284 | 17 | 47 | 77 | 107 | 137 | 167 | 197 | 227 | 257 | 287 | 20 | 50 | 80 | 110 | 140 | 170

INTERLEAVING METHOD AND SYSTEM

CROSS-REFERENCE TO RELATED APPLICATIONS

This application claims priority from Korean Patent Application No. 10-2005-0065495 filed on Jul. 19, 2005 in the Korean Intellectual Property Office, the entire contents of which are incorporated herein by reference.

BACKGROUND OF THE INVENTION

1. Field of the Invention

Methods and systems consistent with the present invention relate to interleaving, and more particularly, to interleaving depending on readout order decisions.

2. Description of the Related Art

In general, the digital communication systems such as European satellite broadcasting system of the digital video broadcasting standard and U.S.A. terrestrial broadcasting system for High Definition Television (HDTV) randomize, encode, modulate through a modulator, and transmit through transmission cable, MPEG data streams which are synchronized with a transmission clock prior to broadcasting.

Description will be made below in detail on the concept and function of an interleaver.

General communication systems generate random transmission errors occurring sporadically in a random manner, and burst errors clustering at one location.

The burst errors can occur when errors are clustered at one location caused by static electricity from lightening during wireless communications, or when receiving electric power becomes weak on the fading communication lines on which the level of received signal power varies with time.

Since the block codes such Reed-Solomon code can correct only a limited number of bit errors in each code word, correction can be made within the error correction capacity if random errors occur, but block codes are not effective for correcting burst errors.

That is, even though an average bit error rate is reduced because the limited number of bit errors is corrected within each code word by Reed-Solomon coding, an interleaver can improve on the inefficiency of error correcting codes when errors occur in bursts.

Thus, even though burst errors occur on the communication lines when coded data streams are interleaved for randomization of the order and transmitted, a receiver deinterleaves the interleaved data streams to restore the original data streams, changing the burst errors into random errors so that an average error rate can be lowered.

Interleaving randomizes data streams by changing the input and output orders. For example, if data streams are input and stored in the horizontal scan direction on a storage device and the data streams are output in the vertical scan direction, the output data is transmitted in order through communication lines with a bit stream having an interleaving interval of one bit inserted between two input bits.

Hereinafter, description will be made of a conventional interleaving method with reference to the accompanying drawings.

FIG. 1 is a view for showing a structure of data for interleaving.

If 300 data are to be transmitted, for example, the interleaving has to be performed on the 300 data from data number 0 to data number 299. Since the loss of data becomes considerable during transmission if the data are transmitted in the order shown in FIG. 1 as stated above, the interleaving explained with FIG. 2 is performed.

FIG. 2 is a view for showing a data structure obtained when symbol interleaving is applied to the data structure of FIG. 1.

FIG. 2 shows a method storing the data shown in FIG. 1 into three data banks, data bank 0, data bank 1, and data bank 2 denoted by reference numerals 10, 20 and 30, respectively. Data corresponding to the series of data numbers 0 to 299 of FIG. 1 are alternately allocated into the data banks, and sequentially recorded in storage spaces of each data bank as well.

Thus, if three data banks are used for 300 data, each data bank has at least 100 data storage spaces. If the symbol interleaving is performed, the data corresponding to data numbers '0, 3, 6, 9, . . . , 297' are sequentially stored in the storage spaces of the data bank 0 (10), the data corresponding to data numbers '1, 4, 7, 10, . . . , 298' are sequentially stored in the storage spaces of the data bank 1 (20), and the data corresponding to data numbers '2, 5, 8, 11, . . . , 299' are sequentially stored in the storage spaces of the data bank 2 (30).

Next, the data stored in the storage spaces of each of the data banks 1, 2 and 3 (10, 20, and 30) are sequentially read out, and then transmitted.

However, since the symbol interleaving described with FIG. 2 alone cannot fully prevent the data loss during transmissions, an interleaving method as below is additionally proposed.

FIG. 3A is a view for showing a data structure tone-interleaved over the data structure of the data bank 0 (10) shown in FIG. 2, FIG. 3B is a view for showing a data structure tone-interleaved over the data structure of the data bank 1 (20) shown in FIG. 2, and FIG. 3C is a view for showing a data structure tone-interleaved over the data structure of the data bank 2 (30) shown in FIG. 2.

FIGS. 3A, 3B, and 3C are views for showing data structures tone-interleaved over the data structures of the respective data banks shown in FIG. 2. Herein, it is assumed for the tone interleaving that there should be provided as many data storage rows as tone-interleaving processing units (tone-interleaving value L: 10 in FIGS. 3A to 3C) by data bank. The tone interleaving value L can be arbitrarily set to a different value depending on communication environments.

The data banks 10, 20 and 30 have the zero-th data storage rows 10$a$, 20$a$, and 30$a$, the first data storage rows 10$b$, 20$b$, and 30$b$, the second data storage rows 10$c$, 20$c$, and 30$c$, the third data storage rows 10$d$, 20$d$, and 30$d$, the fourth data storage rows 10$e$, 20$e$, and 30$e$, the fifth data storage rows 10$f$, 20$f$, and 30$f$, the sixth data storage rows 10$g$, 20$g$, and 30$g$, the seventh data storage rows 10$h$, 20$h$, and 30$h$, the eighth data storage rows 10$i$, 20$i$, and 30$i$, and the ninth data storage rows 10$j$, 20$j$, and 30$j$.

In FIG. 3A, the data sequentially stored in the storage spaces of the data bank 0 (10) shown in FIG. 2 are sequentially and alternately stored into the data storage rows 10$a$, 10$b$, 10$c$, 10$d$, 10$e$, 10$f$, 10$g$, 10$h$, 10$i$, 10$j$.

Further, the data sequentially stored in the storage spaces of the data bank 0 (10) shown in FIG. 2 are sequentially stored in the storage spaces of the individual data storage rows 10$a$, 10$b$, 10$c$, 10$d$, 10$e$, 10$f$, 10$g$, 10$h$, 10$i$, and 10$j$.

The tone interleaving according to the above principle is applied in the same manner to FIG. 3B and FIG. 3C. The data interleaved in FIG. 2, FIG. 3A, FIG. 3B, and FIG. 3C are first sent sequentially in order from the zero-th data storage row 10$a$ of the data bank 0 (10) to the ninth data storage row 10$j$, sequentially sent in order from the zero-th data storage row 20$a$ of the data bank 20 to the ninth data storage row 20$j$ and, sequentially sent in order from the zero-th data storage row 30a of the data bank 2 (30) to the ninth data storage row 30j.

If the symbol interleaving and the tone interleaving are used for data transmissions, the possibility of damage to data becomes lower than when only the symbol interleaving is used. However, another additional interleaving is proposed for the integrity of data transfer.

FIGS. 4A, 4B, and 4C are views for showing a data structure with cyclic-interleaving-performed over the data structure of each data bank shown in FIGS. 3A, 3B and 3C.

Here, dividing the whole data set into three arrays such as arrays A, B, and C in reading out data of the respective data banks 10, 20 and 30 in FIGS. 3A, 3B, and 3C, the cyclic-interleaving refers to shifting the arrays of each data bank. Further, the number of data of an array in which array shifting occurs is referred to as a cyclic interleaving value Q. The cyclic interleaving value Q can be arbitrarily set to a different value depending on communication environments.

In FIGS. 4A, 4B, and 4C, the data structure of each of data bank 10, 20, and 30 are first divided into three arrays. The first array A is formed with 33 data consecutively read out, and the second array B is formed with 33 data consecutively read out as well. The third array C is formed with 34 data consecutively read out.

The cyclic interleaving in FIG. 4A indicates data readout when array shifting is not carried out. The number of data of the array in which the shifting occurs is '0' so that the cyclic interleaving value becomes '0'. Therefore, the data readout from the data bank 0 (10) is carried out in order of the array A, array B, and array C.

The cyclic interleaving in FIG. 4B indicates the data readout in a state where array shifting is carried out over the array A, and the number of data of the array in which the shifting occurs is '33' so that the cyclic interleaving value Q becomes '33'. Thus, the data readout from the data bank 1 (20) is carried out in order of the array A, array B, and array C.

The cyclic interleaving in FIG. 4C indicates the data readout in a state where array shifting is carried out over the arrays A and B, and the number of data of the array in which the shifting occurs is '66' so that the cyclic interleaving value Q becomes '66'. Thus, the data readout from the data bank 1 (20) is carried out in order of the array B, array C, and array A.

If the cyclic interleaving described with FIGS. 4A, 4B, and 4C is used, the data loss rate can be reduced upon data transmissions.

However, there exist problems in that the additional cyclic interleaving described as above generally requires additional memories in which the data structure cyclic-interleaved over each of the data banks 10, 20, and 30 is stored and the processing speed is lowered in such circumstances.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

The present invention provides an interleaving method and system for performing cyclic interleaving without additional memories for additional cyclic interleaving by mathematically deciding the order of reading data out of data banks storing a result of the symbol interleaving.

According to an aspect of the present invention, there is provided an interleaving method employing symbol interleaving, tone interleaving, and cyclic interleaving in transmitting data, including storing data at write address values of a memory which are sequentially calculated according to a predetermined write address value calculation process; and reading data stored at read address values of the memory which are sequentially calculated according to a predetermined read address value calculation process, wherein the memory has N data banks of which bank address values are 0, 1, 2, . . . , N−1. Each data bank has M storage spaces of which space address values are 0, 1, 2, . . . , M−1. There are D interleaving target data of which data numbers A are 0, 1, 2, . . . , D−1. The storing data operation includes storing the data at storage spaces of data banks, where the storage space addresses are obtained as the integer result of dividing the data numbers A by the result of dividing the total number of data D by the number of storage spaces M in the data bank. The data bank numbers correspond to the remainders obtained by dividing the data numbers A by the result of dividing the total number of data D by the number of storage spaces M in the data bank.

The reading data operation may include calculating integer values E by dividing addition values of readout numbers B and a cyclic interleaving value Q by the number of storage spaces M according to readout order by data bank, wherein the readout numbers B are 0, 1, 2, . . . , M−1; calculating integer values C and remainders S by dividing the integer values E by a tone interleaving value L; calculating the read address values by multiplying the remainders S by the number of storage spaces M, dividing a multiplication result by the tone interleaving value L, and adding a division result to the integer values C; and reading data corresponding to the read address values.

Further, the reading data operation may be sequentially carried out according to the bank address values.

For example, the number of data banks N may be 3, and the number of storage spaces M maybe 100.

Further, the tone interleaving value L may be 10.

Further, the value Q may be 0 when a bank address value is 0, 33 when the bank address value is 1, and 66 when the bank address value is 2.

According to another aspect of the present invention, there is provided an interleaving system employing symbol interleaving, tone interleaving, and cyclic interleaving in transmitting data, including a write address value calculation unit for sequentially calculating write address values of a memory for sequentially storing data according to a predetermined write address value calculation process; and a read address value calculation unit for sequentially calculating read address values of the memory for sequentially reading data according to a predetermined read address value calculation process, wherein the memory has N data banks of which bank address values are 0, 1, 2, . . . , N−1. Each data bank has M storage spaces of which space address values are 0, 1, 2, . . . , M−1. There are D interleaving target data of which data numbers A are 0, 1, 2, . . . , D−1. The storing data operation includes storing the data at storage spaces of data banks, where the storage spaces corresponding to integer values obtained by dividing the data numbers A by the result of dividing the total number of data D by the number of storage spaces M in the data bank. The data bank numbers correspond to the remainders are obtained by dividing the data numbers A by the result of dividing the total number of data D by the number of storage spaces M in the data bank.

The read address value calculation unit may calculate integer values E by dividing addition values of readout numbers B and a cyclic interleaving value Q by the number of storage spaces M according to readout order by data bank, wherein the readout numbers B are 0, 1, 2, ..., M−1, calculates integer values C and remainders S by dividing the integer values E by a tone interleaving value L, and calculating the read address values by multiplying the remainders S by the number of storage spaces M, dividing a multiplication result by the tone interleaving value L, and adding a division result to the integer values C.

Further, the read address value calculation unit may sequentially calculate space address values according to the bank address values.

For example, the number of data banks M may be 3, and the number of storage spaces N maybe 100.

Further, the tone interleaving value L may be 10.

Further, the value Q may be 0 when a bank address value is 0, 33 when the bank address value is 1, and 66 when the bank address value is 2.

The interleaving system may further include a demultiplexer for inputting the write address values from the write address value calculation unit and storing the data according to the write address values.

Additionally, the interleaving system may further include a multiplexer for inputting the read address values from the read address value calculation unit and reading the data according to the read address values.

According to another aspect of the present invention, there is provided a deinterleaving method corresponding to a reverse process of an interleaving method employing symbol interleaving, tone interleaving, and cyclic interleaving in transmitting data stored in data banks, including recognizing readout numbers B in order of reading and receiving data; calculating integer values E by dividing addition values of the readout numbers B and a cyclic interleaving value Q for each data bank by the number of storage spaces M; calculating integer values C and remainders S by dividing the integer values E by a tone interleaving value L; calculating space address values by multiplying the remainders S by the number of storage spaces M, dividing a multiplication value by the tone interleaving value L, and adding the integer values C to a division value; and storing received data at storage spaces corresponding to the calculated space address values.

According to another aspect of the present invention, there is provided an interleaving method employing at least one interleaving in transmitting data, including storing data at write address values of a memory which are sequentially calculated according to a predetermined write address value calculation process; and reading data stored at read address values of the memory which are sequentially calculated according to a predetermined read address value calculation process, wherein the memory has N data banks of which bank address values are 0, 1, 2, ..., N−1. Each data bank has M storage spaces of which space address values are 0, 1, 2, ..., M−1. There are D interleaving target data of which data numbers A are 0, 1, 2, ..., D−1. The storing data operation includes storing the data at storage spaces of data banks, where the storage spaces corresponding to integer values obtained by dividing the total number of data D by the number of storage spaces M in the data bank. The data bank numbers correspond to remainders obtained by dividing the data numbers A by the result of dividing the total number of data D by the number of storage spaces M resulting the data bank.

The reading data operation may include calculating integer values E by dividing addition values of readout numbers B and a cyclic interleaving value Q by the number of storage spaces M according to readout order by data bank, wherein the readout numbers B are 0, 1, 2, ..., M−1; calculating integer values C and remainders S by dividing the integer values E by a tone interleaving value L; calculating the read address values by multiplying the remainders S by the number of storage spaces M, dividing a multiplication result by the tone interleaving value L, and adding a division result to the integer values C; and reading data corresponding to the read address values.

Further, the reading data operation may be sequentially carried out according to the bank address values.

According to another aspect of the present invention, there is provided an interleaving system employing at least one interleaving in transmitting data, including a write address value calculation unit for sequentially calculating write address values of a memory for sequentially storing data according to a predetermined write address value calculation process; and a write address value calculation unit for sequentially calculating read address values of the memory for sequentially reading data according to a predetermined read address value calculation process, wherein the memory has N data banks of which bank address values are 0, 1, 2, ..., N−1. Each data bank has M storage spaces of which space address values are 0, 1, 2, ..., M−1. There are D interleaving target data of which data numbers A are 0, 1, 2, ..., D−1. The storing data operation includes storing the data at storage spaces of data banks, where the storage spaces corresponding to integer values obtained as the result of dividing the data numbers A by the result of dividing the total number of data D by the number of storage spaces M in the data bank. The data bank numbers correspond to the remainders obtained by dividing the data numbers A by the result of dividing the total number of data D by the number of storage spaces M in the data bank.

The read address value calculation unit may calculate integer values E by dividing addition values of readout numbers B and a cyclic interleaving value Q by the number of storage spaces M according to readout order by data bank, wherein the readout numbers B are 0, 1, 2, ..., M−1, calculates integer values C and remainders S by dividing the integer values E by a tone interleaving value L, and calculating the read address values by multiplying the remainders S by the number of storage spaces M, dividing a multiplication result by the tone interleaving value L, and adding a division result to the integer values C.

Further, the read address value calculation unit may sequentially calculate space address values according to the bank address values.

According to another aspect of the present invention, there is provided a deinterleaving method corresponding to a reverse process of an interleaving method employing at least one interleaving in transmitting data stored in data banks, including recognizing readout numbers B in order of reading and receiving data; calculating integer values E by dividing addition values of the readout numbers B and a cyclic interleaving value Q for each data bank by the number of storage spaces M; calculating integer values C and remainders S by dividing the integer values E by a tone interleaving value L; calculating space address values by multiplying the remainders S by the number of storage spaces M, dividing a multiplication value by the tone interleaving value L, and adding the integer values C to a division value; and storing received data at storage spaces corresponding to the calculated space address values.

BRIEF DESCRIPTION OF THE DRAWINGS

The above and other aspects of the present invention will be more apparent by describing certain exemplary embodiments of the present invention with reference to the accompanying drawings, in which:

FIG. 1 is a view for showing a structure of data for interleaving;

FIG. 2 is a view for showing a data structure symbol-interleaved over the data structure of FIG. 1;

FIG. 3A is a view for showing a data structure tone-interleaved over a data structure of the data bank 0 (10) of FIG. 2;

FIG. 3B is a view for showing a data structure tone-interleaved over a data structure of the data bank 1 (20) of FIG. 2;

FIG. 3C is a view for showing a data structure tone-interleaved over a data structure of the data bank 2 (30) of FIG. 2;

FIGS. 4A, 4B, and 4C are views for showing data structures cyclic-interleaved over the individual data banks of FIGS. 3A, 3B, and 3C.

DESCRIPTION OF THE EXEMPLARY EMBODIMENTS

Figure 5:
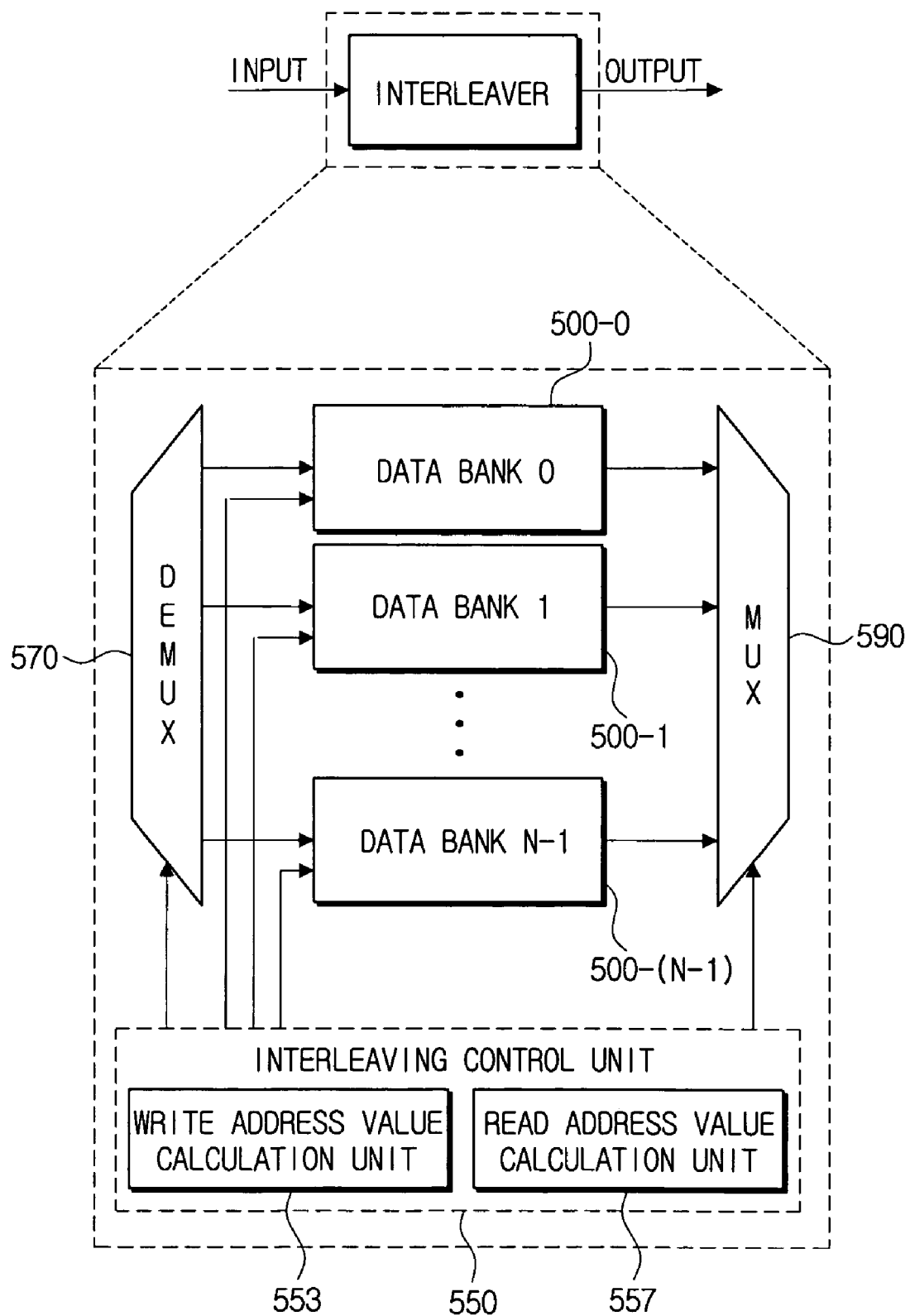
FIG. 5 is a view for schematically showing an interleaver according to an exemplary embodiment of the present invention.

Hereinafter, the exemplary embodiments of the present invention will be described in detail with reference to the accompanying drawings.

FIG. 5 is a view for schematically showing an interleaver according to an exemplary embodiment of the present invention. The interleaver according to an exemplary embodiment of the present invention includes N data banks 500-0, 500-1, 500-2, ..., 500-(N−1), an interleaving control unit 550, a demultiplexer 570, and a multiplexer 590.

The interleaving control unit 550 controls recording and reading data into and out of data banks, and has a write address value calculation unit 553 and a read address value calculation unit 557.

The write address value calculation unit 553 calculates address values (write address values) of storage spaces for storing symbol-interleaved data sequentially into each of the data banks 500-0, 500-1, 500-2, ..., 500-(N−1), and inputs the address values to the demultiplexer 570.

The read address value calculation unit 557 calculates address values (read address values) of storage spaces for data for readout and inputs the address values to the multiplexer 590 in readout order so that the data, which are symbol-interleaved and sequentially stored in each of the data banks 500-0, 500-1, 500-2, ..., 500-(N−1), can be read out in the cyclic-interleaved format as a result.

The demultiplexer 570 inputs write address values calculated in the write address value calculation unit 553 of the interleaving control unit 550, and sends corresponding data to a data bank corresponding to the write address values. The multiplexer 590 inputs read address values calculated in the read address value calculation unit 557 of the interleaving control unit 550 and outputs data of a data bank corresponding to the read address values out of the interleaver.

Hereinafter, description will be made of a process of the write address value calculation unit 553 of the interleaving control unit 550.

The write address value calculation unit 553 calculates write address values in order for symbol-interleaved data to be sequentially stored in the respective data banks 500-0, 500-1, 500-2, ..., 500-(N−1). Here, the write address values are bank address values and space address values.

The bank address values are used to decide in which bank of the N data banks data are stored in, and the bank address values become "0, 1, 2, ..., (N−1)" depending on the respective data banks 500-0, 500-1, 500-2, ..., 500-(N−1).

The space address values are address values determining the space locations in which corresponding data are stored, the space locations being in corresponding data banks determined by the bank address values. When each of the data banks 500-0, 500-1, 500-2, ..., 500-(N−1) includes M storage spaces, the space address values become "0, 1, 2, ..., M−1" according to the order of the storage spaces. The total number of data becomes D, the data numbers of which are denoted "0, 1, 2, ..., D−1".

Hereinafter, description will be made of a write address value calculation process based on equations as below.

$$W_B = A \% (D/M) \qquad \text{(Equation 1)}$$

In Equation 1, $W_B$ denotes a bank address value, A denotes a data number for which "0, 1, 2, ..., D−1" are sequentially substituted, D denotes the total number of data, and M denotes the number of storage spaces of each of the data banks.

That is, the bank address value $W_B$ becomes a remainder obtained from dividing the data number A by a value obtained from dividing the total number of data D by the number of storage spaces M in each data bank.

$$W_S = \frac{A}{(D/M)} \qquad \text{(Equation 2)}$$

In Equation 2, $W_S$ denotes a space address value. As in Equation 1, A denotes a data number for which "0, 1, 2, ..., D−1" are sequentially substituted, D denotes the total number of data, and M denotes the number of storage spaces of each of the data banks. That is, the space address value $W_S$ becomes an integer value obtained as the integer result of dividing the data number A by a value obtained from dividing of the total number of data D by the number of storage spaces M in each data bank.

Figures 1, 2:
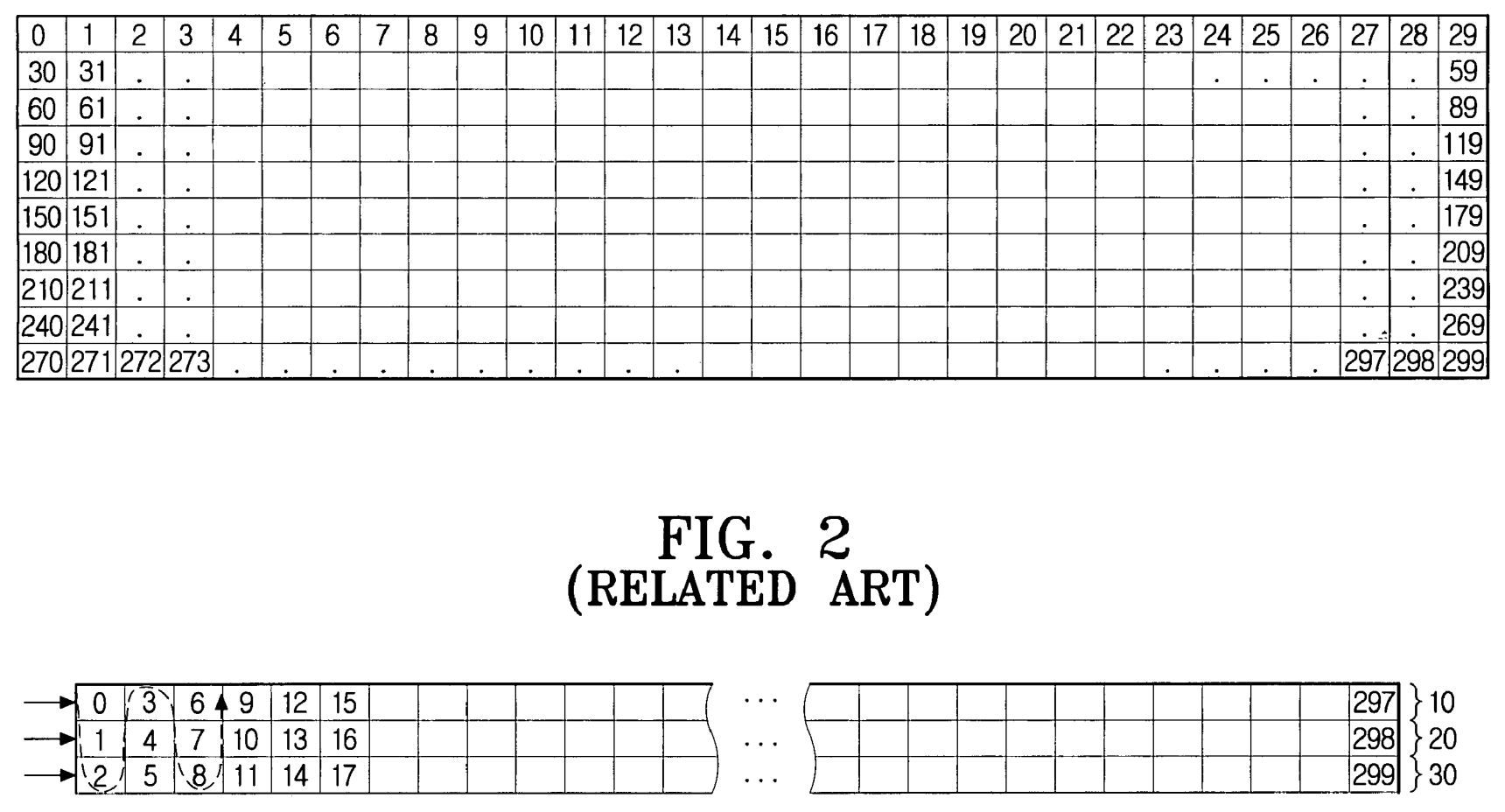

For example, if the total number of data is 300, that is, data numbers from 0 to 299, and data are sequentially stored into the write address values calculated by Equations 1 and 2, the data structure symbol-interleaved in FIG. 2 can be obtained. The total number of data can be arbitrarily a different value depending on circumstances in which the present invention is carried out.

Hereinafter, description will be made of a read address value calculation process in the read address value calculation unit 557 of the interleaving control unit 550.

Even though the structure of the data stored in the data banks 500-0, 500-1, 500-2, ... 500-(N−1) is a symbol-interleaved structure, it is possible to transmit the data in a tone-interleaved structure as well as a cyclic-interleaved structure through order adjustments when the data stored in the respective data banks according to the above write address values are read out.

To do so, the read address value calculation unit 557 calculates space address values, as read address values, at which data are stored that have to be read out according to a readout order (readout numbers: 0, 1, 2, ..., M−1) by each of the data banks 500-0, 500-1, 500-2, ..., 500-(N−1).

Hereinafter, description will be made on a read address value calculation process through Equations 3, 4, and 5 as below.

$$(B+Q) \% M = E \qquad \text{(Equation 3)}$$

$$E = C \times L + S \qquad \text{(Equation 4)}$$

$$R_S = S\left(\frac{M}{L}\right) + C \qquad \text{(Equation 5)}$$

In Equations 3, 4, and 5, B denotes a readout number for which "0, 1, 2, ..., M−1" are sequentially substituted, Q denotes a cyclic interleaving value, M denotes the number of storage spaces in a data bank, L denotes a tone interleaving value, and $R_S$ denotes a space address value, as a read address value, in a corresponding data bank in which data for readout are stored.

Description will be made of a read address value calculation process based on Equations 3, 4, and 5.

For determination of the order of data readout from each data bank, the read address value calculation unit 557 calculates an integer value E corresponding to a remainder obtained by dividing the sum of the readout number B and the cyclic interleaving value Q by the number of storage spaces M according to the readout order (readout numbers: 0, 1, 2, . . . , M−1) by data bank. Next, the read address value calculation unit 557 calculates an integer value C by dividing the integer value E by the tone interleaving value L, and a remainder S from the remainder of the division of the integer value E by the tone interleaving value L. The read address value calculation unit 557 then multiplies the remainder S by the result of the number of storage spaces M divided by the tone interleaving value L, and adds the integer value C to the result of the multiplication, thereby calculating a read address value $R_S$. The read address value calculation unit 557 then transmits the read address value $R_S$ to the multiplexer 590, and the multiplexer 590 outputs the stored data to corresponding read address values.

The above read address value calculations and the readouts of corresponding data are performed in order by data bank, and, when read address values are calculated for the data bank 0, Q becomes "0" as Q0.

When read address values are calculated for the data bank 1, Q becomes Q1, and Q1 becomes the number of data in a unit shift array. When read address values are calculated for the data bank 2, Q becomes "Q2=2*Q1", which can be generalized to "Qn=n*Q1" when read address values are calculated for the data bank n.

In an implementation of an exemplary embodiment of the present invention, if the number of data banks N is 3 and Q1 is 33, Q for the data bank 0 becomes "0", Q for the data bank 1 becomes "33", and Q for the data bank 2 becomes "66".

If the total number of data is 300, the number of storage spaces M in each data bank is 100, and data readout order is first determined in the data bank 0, the read address value calculation unit 557 calculates an integer value E corresponding to a remainder obtained by dividing the sum of the readout number B and a cyclic interleaving value Q (here, Q=0) by the number of storage spaces M according to the readout order (readout number: 0, 1, 2, . . . , 99) by data bank.

Next, the read address value calculation unit 557 calculates an integer value C by dividing the integer value E by the tone interleaving value L, and calculates a remainder S from the remainder of the division of the integer value E by the tone interleaving value L. The read address value calculation unit 557 then calculates a read address value $R_S$ by multiplying the remainder S by the number of storage spaces M divided by the tone interleaving value L, and adding the integer value C to the result. The read address value calculation unit 557 then transmits the read address value $R_S$ to the multiplexer 590, so that the multiplexer 590 outputs stored data to the corresponding read address value.

If the read address value calculation unit 557 sequentially calculates the read address values according to readout numbers, it can be seen that the data are read out according to the order indicated in an arrow (→) shown in FIG. 4A.

Next, for determination of data readout order for the data bank 1, the read address value calculation unit 557 calculates the integer value E corresponding to a remainder by dividing the sum of the readout number B and a cyclic interleaving value Q (in here, Q=33) by the number of storage spaces M according to the readout order (readout numbers: 0, 1, 2, . . . , 99) by data bank. Next, the read address value calculation unit 557 calculates the integer value C and the remainder S by dividing the integer value E by the tone interleaving value L, multiplying the remainder S by the number of storage spaces M and then dividing a multiplication value by the tone interleaving value L, calculates a read address value by adding a division value to the integer value C, and transmits an addition value to the multiplexer 590, and the multiplexer 590 outputs data stored at a corresponding read address value.

Figure 4B:
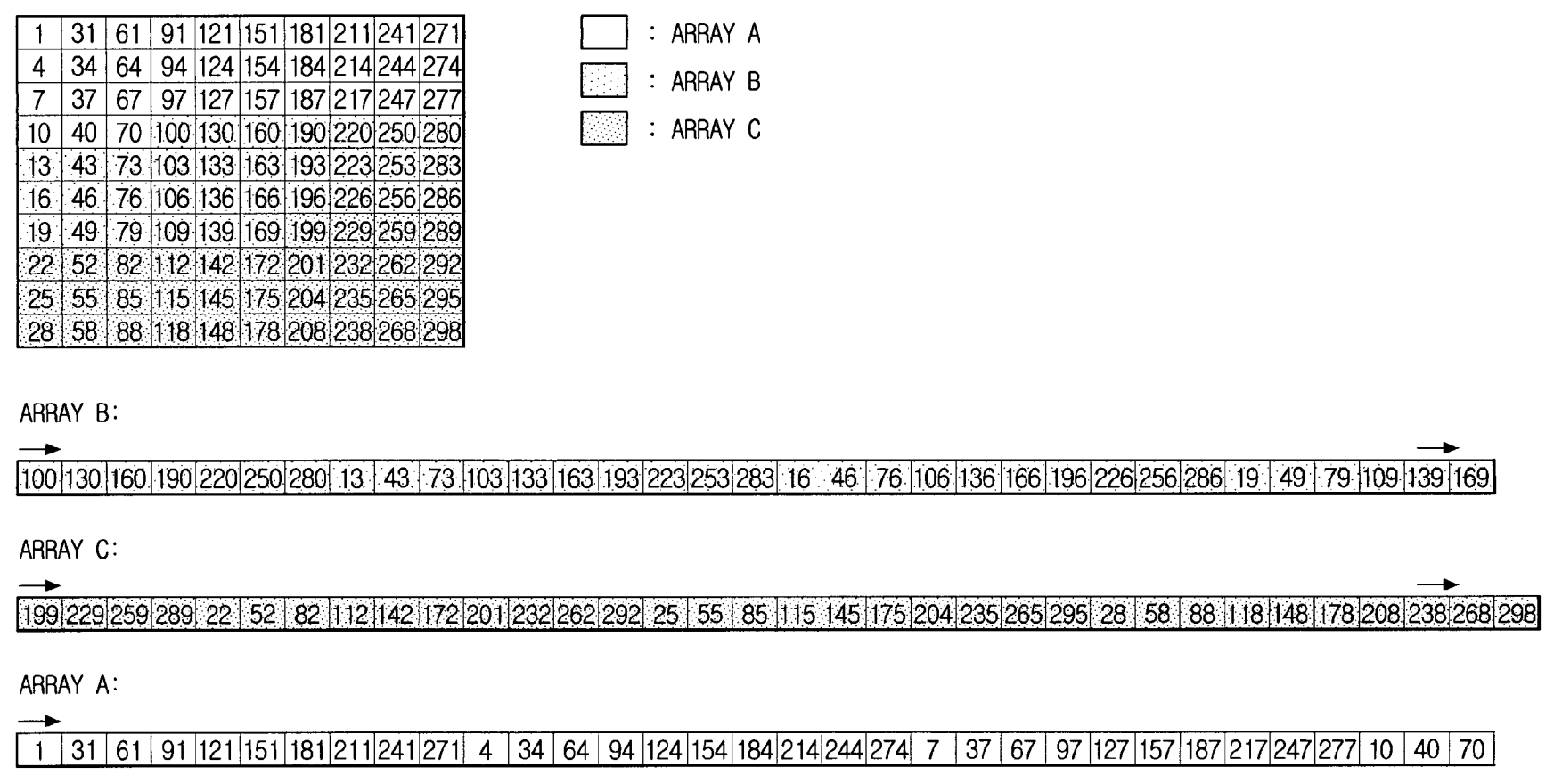

If the read address value calculation unit 557 sequentially calculates read address values according to the readout numbers, it can be seen that data are read out according to the order indicated in an arrow (→) shown in FIG. 4B.

Next, for determination of the data readout order for the data bank 2, the read address value calculation unit 557 calculates the integer value E corresponding to a remainder by dividing the sum of the readout number B and the cyclic interleaving value Q (in here, Q=66) by the number of storage spaces M according to the readout order (readout numbers: 0, 1, 2, . . . , 99) by data bank. Next, the read address value calculation unit 557 calculates the integer value C and the remainder S by dividing the integer value E by the tone interleaving value L, calculates a read address value by multiplying the remainder S by the number of storage spaces M, dividing a multiplication result by the tone interleaving value L, and adding a division result to the integer value C, transmits the read address value to the multiplexer 590, and the multiplexer 590 outputs data stored at the corresponding read address value.

If the read address value calculation unit 557 sequentially calculates read address values according to the readout numbers, it can be seen that data are read out according to the order indicated in the arrow (→) shown in FIG. 4C.

If data are transmitted in the above manner from the transmitter, the receiver receives interleaved data as above and restores original data prior to the interleaving, which is referred to as deinterleaving. Description will be made of a deinterleaving method and system according to an exemplary embodiment of the present invention. The deinterleaver includes data banks corresponding to data banks of an interleaver, and data transmitted from the storage spaces of each data bank of the interleaver are stored in storage spaces corresponding to a data bank of their own.

That is, the deinterleaver recognizes the readout number B according to the above readout order in order of data received, and calculates the integer value B corresponding to a remainder by adding the readout number B to the cyclic interleaving value Q for each data bank and dividing the sum by the number of storage spaces M. Next, the deinterleaver calculates the integer value C and the remainder S by dividing the integer value E by the tone interleaving value L, calculates a space address value by multiplying the remainder S by the number of storage spaces M, dividing a multiplication value by the tone interleaving value L, and adding a division value to the integer value C, and stores received data in storage spaces corresponding to the calculated space address values.

The above interleaving method and system according to the present invention can be generally applied to the Multi-Band OFDM Alliance (MBOA) and the Ultra Wide Band (UWB).

Further, for an implementation of an exemplary embodiment of the present invention, different values can be arbitrarily applied for the number of data (D), the tone interleaving value L, the cyclic interleaving value Q, and so on, depending on communication environments.

As aforementioned, the present invention can perform efficient cyclic interleaving and deinterleaving without additional memories.

Further, The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An interleaving method for transmitting data, the method comprising:

storing data at write address values in a memory which are sequentially determined according to a predetermined write address value calculation process; and reading data stored at read address values of the memory which are sequentially determined according to a predetermined read address value calculation process, wherein the memory has N data banks, each data bank has M storage spaces, there are D total interleaving target data with data numbers A, N, M and D are integers not less than one, and A is an integer not less than zero, and the storing data comprises storing the data at storage spaces of data banks, determining the storage spaces corresponding to integer values obtained by dividing the data numbers A by a result of dividing the total number of data D by the number of storage spaces M, and determining the data banks corresponding to remainders obtained by dividing the data numbers A by the result of dividing the total number of data D by the number of storage spaces M, and the reading data comprises determining integer values L corresponding to remainders obtained by dividing a sum of readout numbers B and a cyclic interleaving value Q by the number of storage spaces M according to readout order by data bank, determining integer values C and remainders S by dividing the integer values E by a tone interleaving value L, determining the read address values by multiplying the remainders S by the result of the number of storage spaces M divided by the tone interleaving value L, and adding the integer values C and reading data corresponding to the read address values, M being an integer not less than one, E being integers not less than zero and not more than M, B and Q being integers not less than zero, L being an integer not less than two, S being an integer not less than zero and not more than L, and C being an integer not less than zero.

2. The interleaving method as claimed in claim 1, wherein the data banks have bank address values 0, 1, 2, ..., N−1.

3. The interleaving method as claimed in claim 1, wherein the data bank storage spaces have space address values 0, 1, 2, ..., M−1.

4. The interleaving method as claimed in claim 1, wherein the interleaving target data numbers A are 0, 1, 2, ..., D−1.

5. The interleaving method as claimed in claim 1, wherein the readout numbers B are 0, 1, 2, ..., M−1.

6. The interleaving method as claimed in claim 1, wherein the reading data is sequentially carried out according to the bank address values.

7. The interleaving method as claimed in claim 1, wherein the number of data banks N is 3, and the number of storage spaces M is 100.

8. The interleaving method as claimed in claim 1, wherein the tone interleaving value L is 10.

9. The interleaving method as claimed in claim 1, wherein the value Q is 0 if a bank address value is 0, 33 if the bank address value is 1, and 66 if the bank address value is 2.

10. An interleaving system for transmitting data, the system comprising:

a write address value calculation unit which sequentially calculates write address values in a memory for sequentially storing data according to a predetermined write address value calculation process; and a read write address value calculation unit which sequentially calculates read address values of the memory for sequentially reading data according to a predetermined read address value calculation process, wherein the memory has N data banks, each data bank has M storage spaces, there are D interleaving target data having data numbers A, N, M and D are integers not less than one, and A is an integer not less than zero, the storing data includes storing the data at storage spaces of data banks, the storage spaces corresponding to integer values obtained by dividing the data numbers A by a result of dividing the total number of data D by the number of storage spaces M, and obtaining the data banks corresponding to remainders obtained by dividing the data numbers A by the result of dividing the total number of data D by the number of storage spaces M, and the reading data comprises determining integer values E corresponding to remainders obtained by dividing a sum of readout numbers B and a cyclic interleaving value Q by the number of storage spaces M according to readout order by data bank, determining integer values C and remainders S by dividing the integer values E by a tone interleaving value L, determining the read address values by multiplying the remainders S by the result of the number of storage spaces M divided by the tone interleaving value L, and adding the integer values C and reading data corresponding to the read address values, M being an integer not less than one, L being integers not less than zero and not more than M, B and Q being integers not less than zero, L being an integer not less than two, S being an integer not less than zero and not more than L, and C being an integer not less than zero.

11. The interleaving system as claimed in claim 10, wherein the data banks have bank address values 0, 1, 2, ..., N−1.

12. The interleaving system as claimed in claim 10, wherein the data bank storage spaces have space address values 0, 1, 2, ..., M−1.

13. The interleaving system as claimed in claim 10, wherein the interleaving target data numbers A are 0, 1, 2, ..., D−1.

14. The interleaving system as claimed in claim 10, wherein the read address value calculation unit sequentially calculates space address values according to the bank address values.

15. The interleaving system as claimed in claim 10, wherein the number of data banks N is 3, and the number of storage spaces M is 100.

16. The interleaving system as claimed in claim 10, wherein the tone interleaving value L is 10.

17. The interleaving system as claimed in claim 10, wherein the value Q is 0 if a bank address value is 0, 33 if the bank address value is 1, and 66 if the bank address value is 2.

18. The interleaving system as claimed in claim 10, further comprising:
a demultiplexer which inputs the write address values from the write address value calculation unit and stores the data according to the write address values.

19. The interleaving system as claimed in claim 10, further comprising:
a multiplexer which inputs the read address values from the read address value calculation unit and reads the data according to the read address values.

20. The interleaving method as claimed in claim 10, wherein the readout numbers B are 0, 1, 2, . . . , M−1.

21. A deinterleaving method corresponding to a reverse process of an interleaving method for transmitting data stored in data banks, the deinterleaving method comprising:
recognizing readout numbers B in order of reading and receiving data;
calculating integer values E corresponding to remainders obtained by dividing sums of the readout numbers B and a cyclic interleaving value Q for each data bank by a number of storage spaces M;
calculating integer values C and remainders S by dividing the integer values E by a tone interleaving value L;
calculating space address values by multiplying the remainders S by a result of the number of storage spaces M divided by the tone interleaving value L, and adding the integer values C; and
storing received data at storage spaces corresponding to the calculated space address values, M being an integer not less than one, E being integers not less than zero and not more than M, B and Q being integers not less than zero, L being an integer not less than two, S being an integer not less than zero and not more than L, and C being an integer not less than zero.

22. An interleaving method employing at least one interleaving in transmitting data, the interleaving method comprising:
storing data at write address values of a memory which are sequentially calculated according to a predetermined write address value calculation process; and
reading data stored at read address values of the memory which are sequentially calculated according to a predetermined read address value calculation process,
wherein the memory has N data banks, each data bank has M storage spaces, there are D interleaving target data having data numbers A,
wherein N, M and D are integers not less than one, and A is an integer not less than zero,
the storing data includes storing the data at storage spaces of data banks, the storage spaces corresponding to integer values obtained by dividing the data numbers A by a result of dividing the total number of data D by the number of storage spaces M and obtaining the data banks corresponding to remainders obtained by dividing the data numbers A by the result of dividing the total number of data D by the number of storage spaces M, and
the reading data comprises determining integer values E corresponding to remainders obtained by dividing a sum of readout numbers B and a cyclic interleaving value Q by the number of storage spaces M according to readout order by data bank, determining integer values C and remainders S by dividing the integer values E by a tone interleaving value L, determining the read address values by multiplying the remainders S by the result of the number of storage spaces M divided by the tone interleaving value L, and adding the integer values C and reading data corresponding to the read address values, M being an integer not less than one, E being integers not less than zero and not more than M, B and Q being integers not less than zero, L being an integer not less than two, S being an integer not less than zero and not more than L, and C being an integer not less than zero.

23. The interleaving method as claimed in claim 22, wherein the data banks have bank address values 0, 1, 2, . . . , N−1.

24. The interleaving method as claimed in claim 22, wherein the data bank storage spaces have space address values 0, 1, 2, . . . , M−1.

25. The interleaving method as claimed in claim 22, wherein the interleaving target data numbers A are 0, 1, 2, . . . , D−1.

26. The interleaving method as claimed in claim 22, wherein the reading data is sequentially carried out according to the bank address values.

27. The interleaving method as claimed in claim 22, wherein the readout numbers B are 0, 1, 2, . . . , M−1.

28. An interleaving system employing at least one interleaving in transmitting data, the interleaving method comprising:
a write address value calculation unit for sequentially calculating write address values of a memory for sequentially storing data according to a predetermined write address value calculation process; and
a read write address value calculation unit for sequentially calculating read address values of the memory for sequentially reading data according to a predetermined read address value calculation process,
wherein the memory has N data banks, each data bank has M storage spaces, there are D interleaving target data having data numbers A, and the storing data includes storing the data at storage spaces of data banks,
N, M and D are integers not less than one, and A is an integer not less than zero,
the storage spaces corresponding to integer values obtained by dividing the data numbers A by a result of dividing the total number of data D by the number of storage spaces M, and obtaining the data banks corresponding to remainders obtained by dividing the data numbers A by a result of dividing the total number of data D by the number of storage spaces M, and
the read address value calculation unit calculates integer values E corresponding to remainders obtained by dividing addition values of readout numbers B and a cyclic interleaving value Q by the number of storage spaces M according to readout order by data bank, calculates integer values C and remainders S by dividing the integer values E by a tone interleaving value L, and calculating the read address values by multiplying the remainders S by the result of the number of storage spaces M divided by the tone interleaving value L, and adding the integer values C, M being an integer not less than one, E being integers not less than zero and not more than M, B and Q being integers not less than zero, L being an integer not less than two, S being an integer not less than zero and not more than L, and C being an integer not less than zero.

29. The interleaving method as claimed in claim 28, wherein the data banks have bank address values 0, 1, 2, . . . , N−1.

30. The interleaving method as claimed in claim 28, wherein the data bank storage spaces have space address values 0, 1, 2, . . . , M−1.

31. The interleaving method as claimed in claim 28, wherein the interleaving target data numbers A are 0, 1, 2, . . . , D−1.

32. The interleaving method as claimed in claim 28, wherein the readout numbers B are 0, 1, 2, . . . , M−1.

33. The interleaving system as claimed in claim 28, wherein the read address value calculation unit sequentially calculates space address values according to the bank address values.

34. A deinterleaving method corresponding to a reverse process of an interleaving method employing at least one interleaving in transmitting data stored in data banks, the deinterleaving method comprising:

recognizing readout numbers B in order of reading and receiving data;

calculating integer values E corresponding to remainders obtained by dividing sums of the readout numbers B and a cyclic interleaving value Q for each data bank by a number of storage spaces M;

calculating integer values C and remainders S by dividing the integer values E by a tone interleaving value L;

calculating space address values by multiplying the remainders S by a result of the number of storage spaces M divided by the tone interleaving value L, and adding the integer values C; and storing received data at storage spaces corresponding to the calculated space address values, M being an integer not less than one, E being integers not less than zero and not more than M, B and Q being integers not less than zero, L being an integer not less than two, S being an integer not less than zero and not more than L, and C being an integer not less than zero.

\* \* \* \* \*